United States Patent
Shi et al.

(10) Patent No.: US 10,332,540 B2
(45) Date of Patent: Jun. 25, 2019

(54) FILTER COEFFICIENT UPDATING IN TIME DOMAIN FILTERING

(71) Applicant: DOLBY LABORATORIES LICENSING CORPORATION, San Francisco, CA (US)

(72) Inventors: Dong Shi, Shanghai (CN); Xuejing Sun, Beijing (CN)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 15/753,070

(22) PCT Filed: Sep. 15, 2016

(86) PCT No.: PCT/US2016/051994
§ 371 (c)(1),
(2) Date: Feb. 15, 2018

(87) PCT Pub. No.: WO2017/048997
PCT Pub. Date: Mar. 23, 2017

(65) Prior Publication Data
US 2018/0254053 A1   Sep. 6, 2018

Related U.S. Application Data

(60) Provisional application No. 62/222,960, filed on Sep. 24, 2015.

(30) Foreign Application Priority Data

Sep. 18, 2015   (CN) .......................... 2015 1 0599861
Oct. 30, 2015   (EP) .................................... 15192398

(51) Int. Cl.
*H03H 17/02*   (2006.01)
*G10L 25/18*   (2013.01)
(Continued)

(52) U.S. Cl.
CPC .............. *G10L 25/18* (2013.01); *G10L 25/48* (2013.01); *H03H 17/0227* (2013.01);
(Continued)

(58) Field of Classification Search
CPC ..... G10L 25/18; G10L 25/48; H03H 17/0227; H03H 21/0025; H03H 17/0294; H03H 21/0043
See application file for complete search history.

(56) References Cited

U.S. PATENT DOCUMENTS 7,277,554 B2   10/2007   Kates
7,774,396 B2    8/2010   Dickson
(Continued)

FOREIGN PATENT DOCUMENTS

EP         2 530 480         12/2012

OTHER PUBLICATIONS

Lim, Yong Ching et al "A Weighted Least Squares Algorithm fr Quasi-Equiriple FIR and IIR Digital Filter Design" IEEE Transactions on Signal Processing Mar. 1992, vol. 30, No. 3, New York, USA.
(Continued)

*Primary Examiner* — Sonia L Gay

(57) ABSTRACT

Example embodiments disclosed herein relate to filter coefficient updating in time domain filtering. A method of processing an audio signal is disclosed. The method includes obtaining a predetermined number of target gains for a first portion of the audio signal by analyzing the first portion of the audio signal. Each of the target gains is corresponding to a linear subband of the audio signal. The method also includes determining a filter coefficients for time domain filtering the first portion of the audio signal so as to approximate a frequency response given by the target gains. The filter coefficients are determined by iteratively selecting at
(Continued)

least one target gain from the target gains and updating the filter coefficient based on the selected at least one target gain. Corresponding system and computer program product for processing an audio signal are also disclosed.

15 Claims, 5 Drawing Sheets

(51) Int. Cl.
    *G10L 25/48*     (2013.01)
    *H03H 21/00*     (2006.01)
(52) U.S. Cl.
    CPC .... *H03H 17/0294* (2013.01); *H03H 21/0025* (2013.01); *H03H 21/0043* (2013.01)

(56) References Cited

U.S. PATENT DOCUMENTS

| | | | |
|---|---|---|---|
| 8,385,864 B2 | 2/2013 | Dickson | |
| 2007/0118367 A1 | 5/2007 | Dickson | |
| 2015/0317995 A1* | 11/2015 | De Vries | G10L 19/265 |
| | | | 704/206 |

OTHER PUBLICATIONS

Zhu, Wei-Ping, et al "Weighted Least-Square Design of FIR Filters Using a Fast Iterative Matrix Inversion Algorithm" IEEE Transactions on Circuits and Systems—I: Fundamental Theory and Applications, vol. 49, No. 11, Nov. 2002, pp. 1620-1628.

* cited by examiner

FILTER COEFFICIENT UPDATING IN TIME DOMAIN FILTERING

CROSS REFERENCE TO RELATED APPLICATIONS

This application claims the benefit of the U.S. Provisional Application No. 62/222,960, filed Sep. 24, 2015; this application also claims priority to Chinese Patent Application No. 201510599861.0, filed Sep. 18, 2015, and European Patent Application No. 15192398.4, filed Oct. 30, 2015, all of which are incorporated by references in their entirety.

TECHNOLOGY

Example embodiments disclosed herein generally relate to audio signal processing, and more specifically, to a method and system for filter coefficient updating in time domain filtering of an audio signal.

BACKGROUND

In order to achieve an audio signal with good quality, it is usually necessary to process the audio signal. Such an audio signal processing task may be performed in a frequency domain or time domain. In a frequency domain scheme, an input audio signal is transformed into the frequency domain so that the audio signal can be analyzed and filtered at the frequency subband level. In a time domain scheme, an input audio signal may be analyzed in time domain or frequency domain and is filtered in time domain. Generally speaking, one or more filters can be designed to process the audio signal for various purposes.

Compared to the frequency domain filtering scheme where the audio signal is processed on a frame basis with long latency and usually undergoes imperfect convolution, the time domain filtering scheme can provide ultra-low latency and improved linear convolution. In many use cases where real time processing with ultra-low latency is needed, such as voice communications, time domain filtering can be advantageously employed.

However, a challenge facing with the use of time domain filtering is the design of a time domain filter. Unlike a frequency domain filter, which can directly change its frequency response by simply adjusting the subband gains of the audio signal in the frequency domain, a time domain filter has to have its filter coefficients adapted so as to approach to a target frequency response as close as possible. Conventionally, the time domain filter used in an audio processing system is pre-trained offline with a fixed filter coefficient and thus a fixed frequency response. However, due to the time-varying nature of audio signal, it is desired to filter the audio signal by using a time domain filter with its filter coefficients adjusted in real time.

SUMMARY

Example embodiments disclosed herein propose a solution for processing an audio signal by adaptively updating a filter coefficient for filtering the audio signal.

In one aspect, example embodiments disclosed herein provide a method of processing an audio signal. The method includes obtaining a predetermined number of target gains for a first portion of the audio signal by analyzing the first portion of the audio signal. Each of the target gains is corresponding to a subband of the audio signal. The subbands may be linearly spaced or arranged differently in the frequency domain, e.g. according to a perceptual criterion. The method also includes determining at least one filter coefficient for filtering the first portion of the audio signal so as to approximate the frequency response given by the obtained target gains. The at least one filter coefficient is determined by iteratively selecting at least one target gain from the target gains and updating the filter coefficient based on the selected at least one target gain. The updating of the at least one filter coefficient is an iterative process and includes updating the filter coefficient(s) based on the filter coefficient(s) of the previous iteration. The method further comprises filtering the first portion of the audio signal in time domain based on the filter coefficient(s). Embodiments in this regard further provide a corresponding computer program product.

In another aspect, example embodiments disclosed herein provide a system for processing an audio signal. The system includes a target gain obtaining module configured to obtain a predetermined number of target gains for a first portion of the audio signal by analyzing the first portion of the audio signal. Each of the target gains is corresponding to a (linear) subband of the audio signal. The system also includes a coefficient determination module configured to determine at least one filter coefficient for filtering the first portion of the audio signal so as to approximate the frequency response given by the obtained target gains. The at least one filter coefficient is determined by iteratively selecting at least one target gain from the target gains and updating the filter coefficient based on the filter coefficient(s) of the previous iteration and the selected at least one target gain. An audio filtering module filters the first portion of the audio signal in time domain based on the updated filter coefficient(s).

Through the following description, it will be appreciated that in accordance with example embodiments disclosed herein, at least one filter coefficient for filtering an audio signal is updated adaptively. A portion of the audio signal is analyzed to obtain a set of target gains with each corresponding to a (linear) subband of the audio signal. The obtained target gains are used to iteratively update the filter coefficient(s) and then the audio signal may be processed as expected based on the updated filter coefficient(s). The filter coefficient(s) may be determined based on a least square method. The filter coefficient(s) may be updated based on the selected at least one target gain and a predetermined mapping matrix. In particular, the updating may comprise selecting a mapping column from the mapping matrix based on the selected at least one target gain. In case of a plurality of selected target gains in an iteration step, the filter coefficients may be updated based on a linear combination of the selected target gains and respective mapping columns from the mapping matrix. In other words where two or more target gains are selected, a sum of the products of the selected target gains with the corresponding mapping columns may be calculated for updating. In example embodiments disclosed herein, depending on the analyzing results of different audio portions, different sets of target gains may be obtained to adjust the filter coefficient accordingly. In this way, it is possible to filter the audio signal with a time-varying filter coefficient. Other advantages achieved by example embodiments disclosed herein will become apparent through the following descriptions.

DESCRIPTION OF DRAWINGS

Through the following detailed description with reference to the accompanying drawings, the above and other objectives, features and advantages of example embodiments disclosed herein will become more comprehensible. In the drawings, several example embodiments disclosed herein will be illustrated in an example and non-limiting manner, wherein.

Throughout the drawings, the same or corresponding reference symbols refer to the same or corresponding parts.

DESCRIPTION OF EXAMPLE EMBODIMENTS

Figure 1:
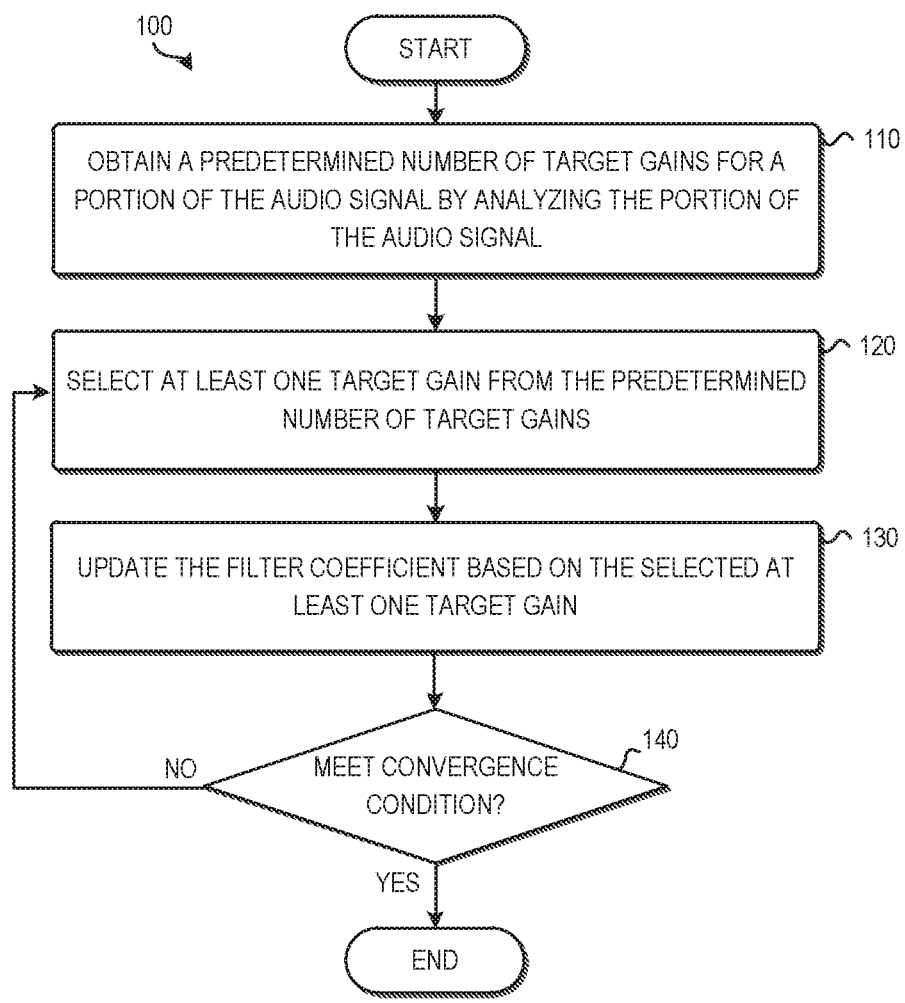
FIG. 1 is a flowchart of a method of processing an audio signal in accordance with one example embodiment disclosed herein.

Principles of example embodiments disclosed herein will now be described with reference to various example embodiments illustrated in the drawings. It should be appreciated that depiction of those embodiments is only to enable those skilled in the art to better understand and further implement example embodiments disclosed herein, not intended for limiting the scope disclosed herein in any manner.

As used herein, the term "includes" and its variants are to be read as open-ended terms that mean "includes, but is not limited to." The term "or" is to be read as "and/or" unless the context clearly indicates otherwise. The term "based on" is to be read as "based at least in part on." The term "one example embodiment" and "an example embodiment" are to be read as "at least one example embodiment." The term "another embodiment" is to be read as "at least one other embodiment".

In order to provide low processing latency and to improve liner convolution performance, a time domain filter is advantageously employed in an audio processing system. On the other hand, since the time domain filtering generally relates to operations such as multiplications and additions, which can be efficiently realized by dedicated circuits in most practical modern digital signal processors (DSPs), the computational complexity of audio processing can also be potentially reduced through the use of the time domain filter. Due to the time-varying nature of an audio signal, it is expected that the time domain filter can be adjusted to process different portions of an audio signal with different filter coefficients and thus different frequency responses.

FIG. 1 is a flowchart of a method of processing an audio signal 100 in accordance with one example embodiment disclosed herein. The method 100 is entered in step 110, where a predetermined number of target gains are obtained for a portion of the audio signal by analyzing the portion of the audio signal. Each of the target gains is corresponding to a linear subband of the audio signal, indicating the expected magnitude gain and/or phrase gain of the subband. In some example embodiments, the whole frequency range of the audio signal may be divided into a plurality of subbands in a linear manner, each of the linear subbands having the same bandwidth.

The obtained target gains constitute a target frequency response for filtering the current portion of the audio signal. The portion of the audio signal, which is analyzed to obtain the predetermined number of target gains, is referred to as a "first portion" or "a first audio portion" hereinafter. Based on the analyzing results of different portions of the audio signal, different sets of target gains may be obtained for respective audio portions. In this sense, the target frequency response may be a time-varying curve in the frequency domain, which, in one example, may be a vector with each element indicating one of the target gains for a portion of the audio signal. In some example embodiments, an audio portion may include one or more audio samples. The length of each analyzed audio portion may not necessarily have the same length, depending on characteristics of the audio signal.

In some example embodiments, the first portion of the audio signal may be analyzed in various aspects so as to determine the target gains. The first audio portion may be transformed into a frequency domain so as to analyze the energy, power, or spectrum characteristics of the audio signal at the subband level in some example embodiments. Alternatively, or in addition, the time-domain characteristics of the first audio portion are analyzed to obtain the target frequency response. Of course, it will be appreciated that the audio signal may be analyzed for any other purposes and the scope of the subject matter disclosed herein is not limited in this regard.

Generally speaking, in order to process the first portion of the audio signal in time domain, a time domain filter should be designed. It is expected that a frequency response of the designed filter is approximate to the target frequency response for this audio portion. In this event, a filter coefficient of the designed filter can be adjusted so as to achieve the target frequency response. In accordance with example embodiments disclosed herein, the obtained target gains can be used to determine the filter coefficient for filtering the first portion of the audio signal in an iterative process in steps 120 to 140.

Particularly, in step 120, at least one target gain is selected from the predetermined number of target gains. Then, in step 130, a filter coefficient for a time domain filter is updated based on the selected at least one target gain. It is understood that the number of filter coefficients for a filter is dependent on the order of this filter. For a 2N-order filter, there are 2N+1 filter coefficients to be determined for filtering the audio signal, where N may be any non-zero integer value.

Generally speaking, there may be a fixed mapping relationship between the filter coefficient(s) and the target gains of the target frequency response. There are various approaches that can be used to calculate the mapping relationship. One of the approaches based on the least square principle is described below as an example.

Given a finite impulsive response (FIR) time domain filter, the filter coefficients may be represented as coefficients of the impulsive response of this filter. In one example, the filter coefficients of the time domain filter may be represented as follow:

$$h=[h(0)h(1)h(2)\ldots h(2N)] \quad (1)$$

where h represents the impulsive response; 2N represents the order of the filter; and h(i) represents a filter coefficient, where i ranges from 0 to 2N. According to Equation (1), the impulsive response h of the time domain filter may be used to represent a set of filter coefficients of this filter.

A symmetric filter can provide a linear phase response, which is desirable in many use cases of audio processing. Therefore, assuming that the FIR time domain filter is a Type-I even symmetric filter, the zero-phrase frequency response of this filter may be determined as a linear combination of the filter coefficients and a complex exponential function related to a digital angular frequency. In one example embodiment, the zero-phrase frequency response of the symmetric FIR filter may be written as follow:

$$F_z(\omega) = \sum_{i=-N}^{N} h(i+N)e^{-j\omega i} \quad (2)$$

where $\omega$ represents a digital angular frequency; $h(i)$ represents a filter coefficient; $e^{-j\omega}$ represents the complex exponential function related to the angular frequency $\omega$; and $F_z(\omega)$ represents the zero-phase frequency response.

It is to be understood that Equation (2) can be extended to other types of filters including asymmetric filters, which is known to those skilled in the art. Based on the symmetry property, the zero-phrase frequency response $F_z(\omega)$ of Equation (2) may be further represented as follow:

$$F_z(\omega) = h(N) + 2\sum_{i=1}^{N} h(i+N)\cos(i\omega) \quad (3)$$

As mentioned above, the target frequency response includes a predetermined number of target gains. It is assumed that the predetermined number is P. Each of the P target gains is corresponding to a subband of the audio signal and indicates the desired magnitude gain and/or phase gain in this subband. In this event, the angular frequency range of the audio signal may be divided in a linear manner to obtain P subbands, $\omega_0, \omega_1, \ldots, \omega_{P-1}$. The target frequency response d may then be represented in a matrix form as $d=[d(\omega_0)\ d(\omega_1)\ d(\omega_2) \ldots d(\omega_{P-1})]^T$ with each target gain $d(\omega_i)$ corresponding to a subband $\omega_i$. Likewise, the zero-phrase frequency response of the filter may also be taken as a matrix form with P gains. For example, the zero-phrase frequency response $F_z$ may be represented in the matrix form as $F_z=[F_z(\omega_0)\ F_z(\omega_1)\ F_z(\omega_2) \ldots F_z(\omega_{P-1})]^T$ with each gain $F_z(\omega_i)$ corresponding to a subband $\omega_i$.

It is expected that the zero-phase frequency response of the time domain filter is approximate to the target frequency response, which can be written in a matrix form as follow:

$$F_z = Ch \approx d \quad (4)$$

where $F_z$ represents the zero-phrase frequency response; h represents a set of filter coefficients; d represents the target frequency response; and C represents a matrix including constant-value elements. In one example, the constant-value matrix C may be determined from Equation (3) as $$C = \begin{bmatrix} 1 & 2\cos(\omega_0) & \ldots & 2\cos(N\omega_0) \\ \vdots & \vdots & \ddots & \vdots \\ 1 & 2\cos(\omega_{P-1}) & \ldots & 2\cos(N\omega_{P-1}) \end{bmatrix}.$$

As can be seen from Equation (4), the filter coefficients h may be determined based on the target frequency response d and the constant-value matrix C. In one example embodiment, by applying the least square method to the above Equation (4), the filter coefficients may be determined as follow:

$$h_{LS} = (C^T C)^{-1} C^T d \quad (5)$$

where $h_{LS}$ represents the filter coefficients determined by the least square method. Denote $(C^T C)^{-1} C^T$ as a constant-value matrix $P=[p_0\ p_1 \ldots p_{P-1}]$, where $p_i$ is the i-th column of the matrix P corresponding to a subband $\omega_i$. The matrix P is a mapping matrix that can correlate the filter coefficients $h_{LS}$ and the target frequency response d. The filter coefficients $h_{LS}$ can thus be calculated as a linear combination of each mapping column $p_i$ and each target gain $d(\omega_i)$. In one example, the filter coefficients $h_{LS}$ may be represented as follow:

$$h_{LS} = \sum_{i=0}^{P-1} d(\omega_i) p_i \quad (6)$$

The mapping matrix P is generally constant for a specific type of time domain filter. Due to the large size of the matrix C (a size of P-by-2N), the overhead for calculating the mapping matrix P is large. In some example embodiments, the mapping matrix P may be pre-computed and stored in a memory for use.

In some example embodiments, the filter coefficient is updated on an audio sample basis. That is, the filter coefficient is updated once in step 130 for each sample of the audio signal. In these embodiments, a target gain may be selected for each round of iterations. The filter coefficients for the current audio sample may be updated from the filter coefficients for a prior audio sample based on the selected target gain and the pre-stored mapping. For example, the filter coefficients may be calculated for each audio sample as follow:

$$h_{LS}(n) = h_{LS}(n-1) + d(\omega_i, n) p_i \quad (7)$$

where $h_{LS}(n)$ represents the filter coefficients for the n-th audio sample; $h_{LS}(n-1)$ represents the filter coefficients for the (n−1)-th audio sample; $d(\omega_i, n)$ represents the target gain for the subband $\omega_i$, which is selected for updating the filter coefficients for the n-th audio sample; and $p_i$ represents the mapping corresponding to the subband $\omega_i$. In some examples, the filter coefficients may be initialized to, for example, random values or some predefined values at the very beginning of the audio signal. In a similar manner, the filter coefficients may be updated for a group of consecutive audio samples. The number of samples in each group of audio samples may be the same, or different. In this case, the filter coefficients are updated once in step 130 for each group of audio samples. A target gain may be selected for each round of iterations, i.e. for each group of audio samples. The filter coefficients for the current audio sample group may be updated from the filter coefficients for a prior audio sample group based on the selected target gain and the pre-stored mapping matrix.

Although it is shown in Equation (7) that only one target gain is selected to update the filter coefficients $h_{LS}(n)$ for an audio sample, it is to be understood that more than one target gain can be used. In the case where two or more target gains are selected, a sum of the products of those target gains with the corresponding mappings may be calculated for updating. In some example embodiments, the index i in Equation (7) may range from 0 to P−1, meaning that the P target gains for the first audio portion are selected in a sequence based on their corresponding subbands. Alternatively, the target gain $d(\omega_i, n)$ used in each round of iterations may be randomly selected from the P target gains. That is, the updating may not necessarily be performed from the low frequency to the high frequency or vice versa. For different rounds of iterations, different target gains from the predetermined number of obtained target gains are selected.

After the filter coefficients are updated once in step 130, in the method 100, it is determined whether a convergence condition is met in step 140. If the updating procedure is not converged, the method 100 returns back to step 120 to go into next iteration. In order to achieve the target frequency response, in some example embodiments, all the target gains may be used to update the filter coefficients. In this case, the convergence condition is determined based on whether all of the P target gains are selected. If the convergence condition is met, the filter coefficient updating procedure ends.

In the case where only one target gain is selected in step 120 for each round of iterations, the frequency response of the time domain filter may be converged to the target frequency response after at most P audio samples. It is to be understood that the determined target frequency response may not vary from sample to sample in most practical use cases, but may progress slowly. In this case, audio samples following the P samples in the first audio portion may be filtered as expected based on the resulting filter coefficients. In one example, the P audio samples can be filtered with the gradually updated filter coefficients.

As can be seen from Equation (7), the number of the target gains P has effects on the convergence speed of the filter coefficient updating procedure as well as the computational complexity. In some example embodiments, in order to achieve a good frequency sampling (avoid missing any anomalies in the target frequency response) and relative low computational complexity in filter coefficient updating, the value of P may be set based on the order of the time domain filter. By way of example, P may be set as a multiple of the order of the time domain filter as follow:

$$P=2QN \qquad (8)$$

where 2N represents the order of the filter; and Q is a positive integer value. In one example, for a time domain filter with an order of 96 (N=48), the number of the target gains may be set to 480 with Q being 5. In this example, using the updating procedure shown in Equation (7), the frequency response of the time domain filter may converge to the target frequency response in 480 samples (or 10 ms for an audio sampling rate of 480 kHz). It is to be appreciated that Q can be set to any other value based on practice experience of those skilled in the art, and the scope of the subject matter disclosed herein is not limited in this regard.

Figure 2:
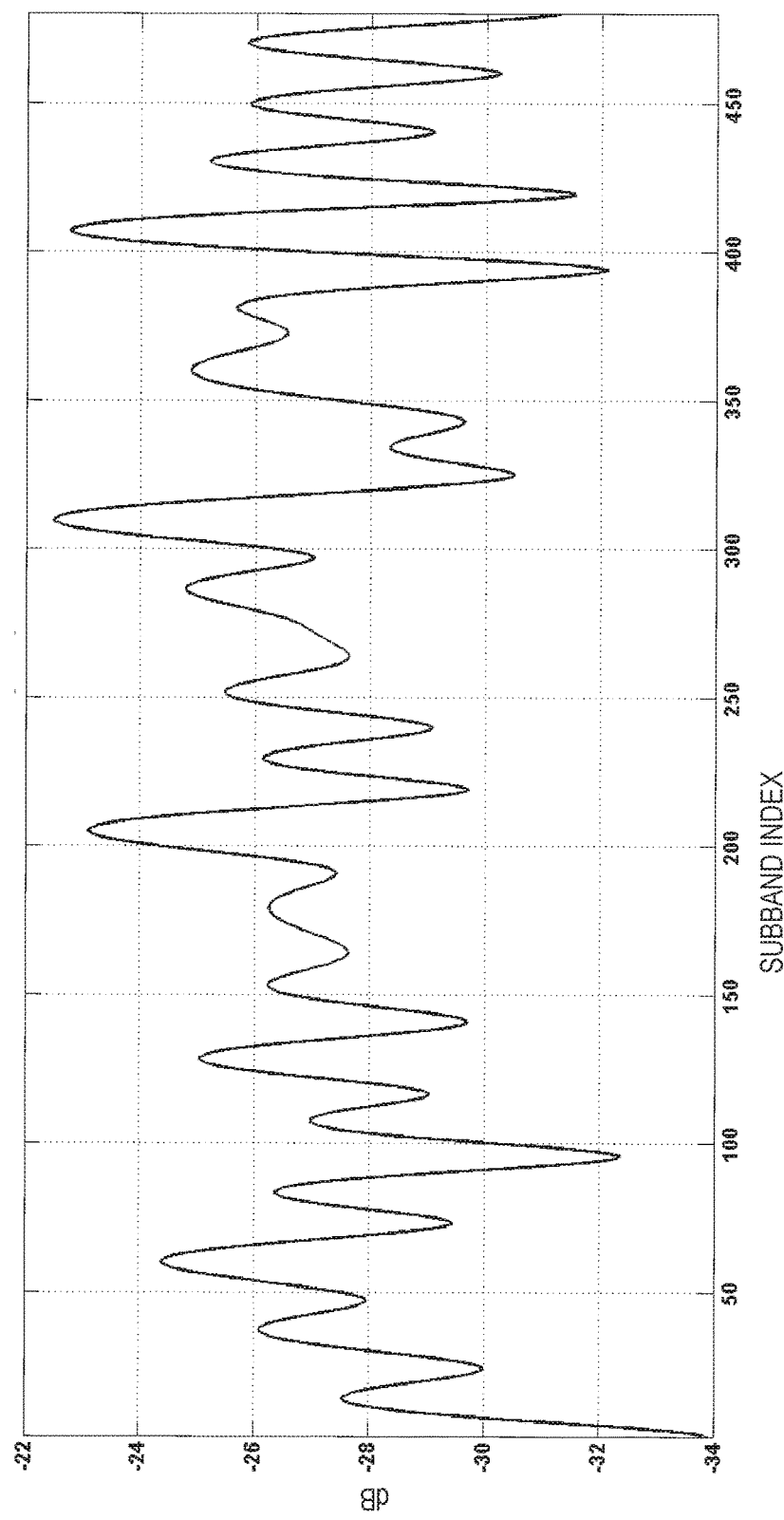
FIG. 2 is a schematic diagram of a target frequency response in accordance with one example embodiment disclosed herein.
Figure 3:
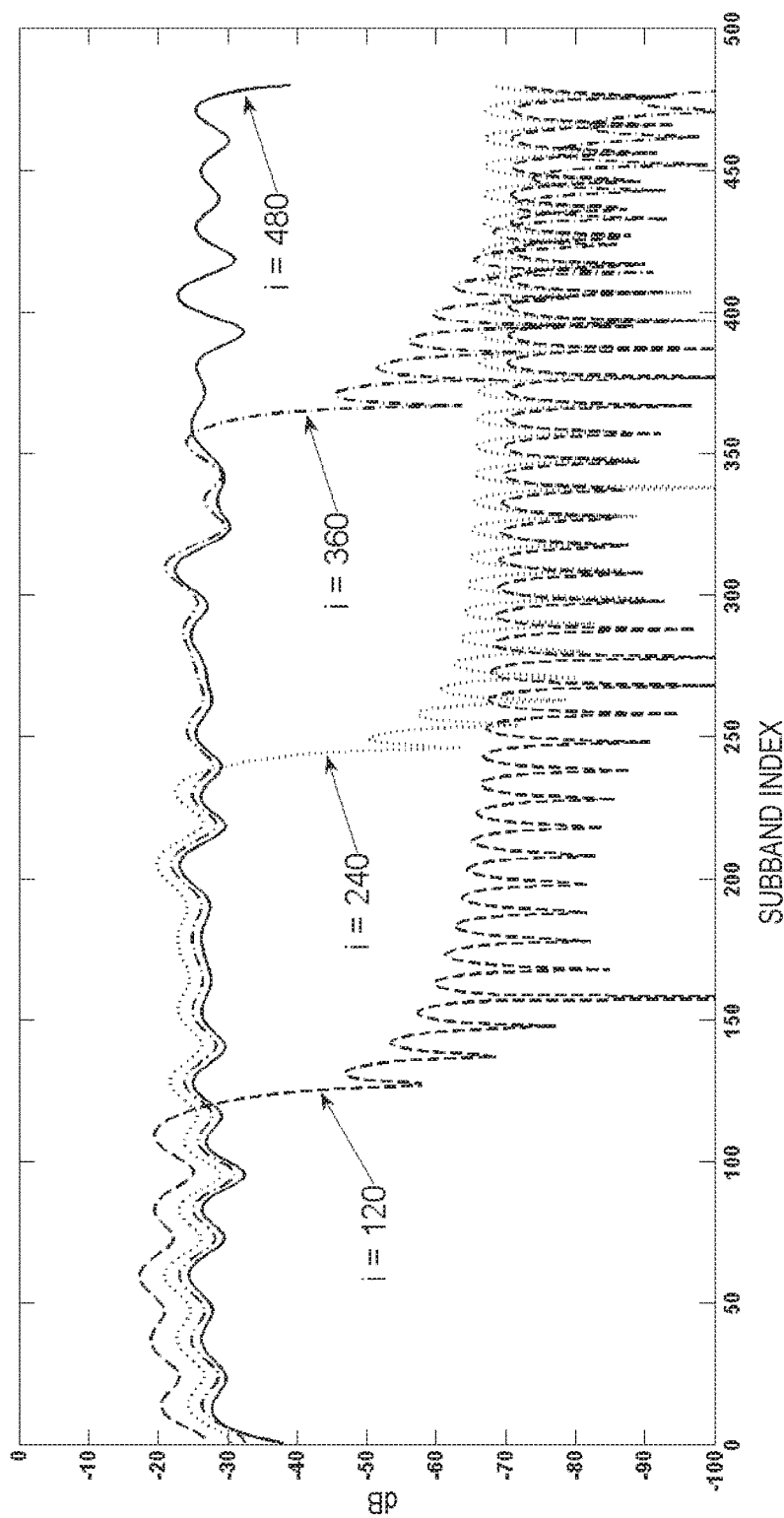
FIG. 3 is a schematic diagram showing a frequency response updating procedure at different sample numbers in accordance with one example embodiment disclosed herein.

FIG. 2 depicts a schematic diagram of a target frequency response with target gains in 480 different subbands. FIG. 3 depicts how the frequency response of the time domain filter progresses at sample numbers of 120, 240, 360, and 480. In the example of FIG. 3, the filter coefficients are updated on a sample basis. As shown, the time domain filter may have a frequency response approximate to the target frequency response in FIG. 3 after 480 samples.

As mentioned above, two or more target gains may be selected from the P target gains for updating the filter coefficients in each round of iterations. In this event, the time taking to achieve the target frequency response may be reduced from a time period of P samples to a much short time period. However, if too many target gains are used in each round of iterations, a peak of computation resource usage may occur at a certain time, which will break the even distribution of computation and thus potentially cause a temporal resource shortage. Therefore, there is a tradeoff between the convergence speed and the even distribution of computation.

In some example embodiments, the number of target gains selected in step 120 may be determined based on available computation resources. If there are sufficient computation resources, more target gains can be selected for updating each time. Otherwise, the filter coefficients may be updated based on only one target gain in each round of iterations. Alternatively, or in addition, the convergence requirement of the filter coefficient updating may be taken into account when selecting the target gain(s). For example, if it is desired that the time domain filter is converged to the target frequency response quickly to obtain the desired output audio signal, more target gains may be selected in each round of iterations so as to increase the convergence speed.

In some other example embodiments, it is detected in step 140 whether new target gains for a subsequent audio portion are obtained, so as to decide if the current iterative process is converged. If new target gains are obtained, the current updating procedure may be stopped so as to adapt the time domain filter based on the new target gains. This may happen when the characteristics of the audio signal change frequently. In this case, the first audio portion in step 110 may be short (for example, include less than P audio samples). Alternatively, or in addition, the convergence condition in step 140 may be set to a predetermined time period or a predetermined number of iterations.

In the filter coefficient updating procedure described above, the computational complexity is dependent on the order of the filter and the number of the target gains used for calculating the filter coefficients. However, the order of the filter is generally predefined so as to achieve some filtering effects. In order to reduce the computational complexity, it is possible to reduce the number of the target gains used in the updating procedure. In some example embodiments, the filter coefficients are updated only when there is a big change of gain in a particular frequency subband. In this event, the targets gains with little changes will not be selected for use.

In one example embodiment, for a first target gain from the P target gains for the first audio portion, a difference between the first target gain and a second target gain for a second audio portion prior to the first audio portion is determined. The first and second target gains are corresponding to a same subband. If the difference is higher than a predetermined threshold, which means that there is a big change of gain in this subband, the first target gain may be selected for updating the filter coefficients. The relationship between the difference and the predetermined threshold may be represented as follow:

$$|d(\omega_i,t)-d(\omega_i,t-1)|>e(\omega_i) \qquad (9)$$

where $d(\omega_i,t)$ represents the first target gain corresponding to the subband $\omega_i$ for the current audio portion t of the audio signal; $d(\omega_i,t-1)$ represents the second target gain corresponding to the same subband $\omega_i$ for a prior audio portion $t-1$; and $e(\omega_i)$ represents the predetermined threshold and may be varied for different subbands in one example. For each of the target gains obtained for the current audio portion, it may be determined whether Equation (9) is met.

If Equation (9) is met, for example, if the difference between the first target gain $d(\omega_i,t)$ and the second target gain $d(\omega_i,t-1)$ is higher than the threshold $e(\omega_i)$, the target gain $d(\omega_i, t)$ can be used to update the filter coefficients for the current audio portion. In some example embodiments, the predetermined threshold $e(\omega_i)$ may be set to a small value for a sensitive frequency subband (for example, a critical band) where small variations in the gain are audible. Otherwise, $e(\omega_i)$ may be set to a relatively large value for an insensitive frequency subband.

In the case where the difference between the first and second target gains is lower than or equal to the predetermined threshold $e(\omega_i)$, the first target gain for the current first audio portion may be discarded. In many use scenarios, the target gains in the different subbands may not vary frequently and not all the target gains change abruptly at the same time. Therefore, only a small number of target gains from the P target gains may be selected for updating the filter coefficients, which can significantly reduce the computational complexity.

In some example embodiments, it is desired to slowly adapt the current frequency response of the time domain filter to the target frequency response, so as to improve the transitional performance and reduce any potential artifact that may arise. To achieve this, before being used for updating, a first target gain from the selected target gains for the first audio portion may be smoothed based on a smoothing factor and a second target gain for a second audio portion prior to the first audio portion. The first and second target gains are corresponding to a same subband. In this manner, the filter coefficients of the time domain filter may undergo smoother and less noisy adaptation.

During the smoothing process, depending on the smoothing factor, the target gains for the current audio portion and for the prior audio portion may have respective contributions to the smoothed target gain. The respective contributions may be combined to determine the smoothed target gain. In one example, a simple first-order recursive smoothing may be represented as follow:

$$d_s(\omega_i, t) = \partial_{\omega_i} d(\omega_i, t-1) + (1 - \partial_{\omega_i}) d(\omega_i, t) \quad (10)$$

where $d(\omega_i, t)$ represents the selected first target gain corresponding to the subband $\omega_i$ for the current audio portion t of the audio signal; $d(\omega_i, t-1)$ represents the second target gain corresponding to the same subband $\omega_i$ for a prior audio portion $t-1$; $\partial_{\omega_i}$ represents the smoothing factor and may be varied for different subbands in one example; and $d_s(\omega_i, t)$ represents the smoothed first target gain. The smoothing factor may be predefined or may be modified online if needed. For each of the selected target gains, the smoothing procedure in Equation (10) may be performed.

In some example embodiments, the filter coefficient updating procedure may be performed on a perceptual subband basis, where the whole frequency range of the audio signal is divided into a number of perceptual subbands. There is a lot of correlation between some neighboring frequency points in the same perceptual subband. Generally, the number of perceptual subbands may be much less than the number of subbands divided in a linear manner. Various criteria are known in the art for dividing the perceptual subbands. For example, the whole frequency range may be divided into a plurality of equivalent rectangular bands (ERBs). In one instance, 20 ERBs may be enough for the audio processing. In this case, only 20 gains are needed to achieve the target frequency response, with each gains corresponding to one of the ERBs.

Since there is correlation between the perceptual subbands and the linear subband, the target gains for the perceptual subbands and the target gains for the linear subbands may be converted from one to the other through a convert matrix. In one example, the target gains may be represented as follow:

$$d = Q g_p \quad (11)$$

where d represents the target frequency response, which is a matrix of target gains corresponding to P linear subbands; Q represents a convert matrix, which is generally a constant matrix dependent on the criteria used in dividing the perceptual subbands; and $g_p$ represents a matrix of target gains corresponding to the perceptual subbands. It is assumed that the number of the perceptual subbands is B, which may be smaller than P. The matrix of target gains $g_p$ may be represented as $g_p = [g_p(b_0) \ g_p(b_1) \ g_p(b_2) \ldots g_p(b_{B-1})]^T$ with each target gain $g_p(b_i)$ corresponding to a perceptual subband $b_i$. The convert matrix Q may be used for converting the P target gains corresponding to the linear subbands into B target gains corresponding to the perceptual subbands.

By substituting Equation (11) into Equation (5), the filter coefficients $h_{LS}$ may be determined as follow:

$$h_{LS} = (C^T C)^{-1} C^T Q g_p \quad (12)$$

Denote $(C^T C)^{-1} C^T Q$ in Equation (12) as a mapping matrix P', where $p'_i$ is the i-th column of the matrix P' corresponding to a perceptual subband $b_i$. The mapping matrix P' is used for mapping the target gains for the perceptual subbands into the filter coefficients. The mapping matrix P' may be pre-computed and stored for use in the filter coefficient updating procedure. After following the same procedure from Equation (6) to Equation (7), the filter coefficients may be calculated for each audio sample as follow:

$$h_{LS}(n) = h_{LS}(n-1) + g_p(b_i, n) p'_i \quad (13)$$

where $g_p(b_i, n)$ represents the target gain for the i-th perceptual subband $b_i$, which is selected for updating the n-th audio sample; and $p'_i$ represents the i-th mapping column in the mapping matrix P'. According to Equation (13), the filter coefficients may be determined based on the target gains for the perceptual subbands in an iterative process. In each round of iterations, one or more target gains for the perceptual subbands may be selected for updating.

It can be seen that the main difference between Equation (13) and Equation (7) lies in that the index i loops over a smaller number. In Equation (7), the index i may loop from 0 to P-1, while in Equation (13), the index i ranges from 0 to B-1, which B is smaller than P. In this way, the computational complexity may be reduced and the convergence of the filter coefficients is accelerated. In one example, the total number of multiplications needed to converge to the target frequency response may be reduced by a factor of $$\frac{P}{B}$$

and so is the time for convergence. In the example where P is 480 and B is 20, the filter coefficients may converge 24 times faster (or in about 0.4 ms for an audio sampling rate of 480 kHz) on the perceptual subband basis. In addition, the memory space required to store the pre-computed mapping matrix P' is also reduced by a factor of $$\frac{P}{B},$$

which is a benefit for audio processing devices with limited memory.

In some example embodiments, the number of the target gains $g_p(b_i, n)$ that are selected for updating the filter coefficients each time may be determined by taking the available computation resources and/or the specific convergence requirement in to account. In some other example embodiments, a target gain for a particular perceptual subband may not be used unless there is a big change of gain in this perceptual subband, which may further reduce the computational complexity. Alternatively, or in addition, the target gains for the perceptual subbands may be smoothed over samples of the audio signal. This smoothing procedure is similar to that procedure of the target gains for the linear subbands described above, which is not repeated here.

With the updated filter coefficients, a time domain filter may be designed to provide the target frequency response and then be used to filter the audio signal in time domain. The time domain filter may be designed dependent on the type of processing. In some example embodiments, the time domain filter may be a Finite Impulse Response (FIR) filter or an Infinite Impulse Response (IIR) filter. In some examples, to achieve liner phase (constant group delay), a symmetric FIR filter may be selected. According to some specific processing requirements, the time domain filter may also be shaped as a low pass filter, a high pass filter, a band pass filter, a band rejection filter, or a notch filter. It will be appreciated that any other kinds of filters may also be utilized as required and the scope of the subject matter disclosed herein is not limited in this regard.

Using a 2N-order FIR time domain filter as an example, the current input audio sample and 2N prior input audio samples may be multiplied with respective (2N+1) filter coefficients. The products of the multiplications may be summed together to determine the output audio signal. For example, the output audio signal y(n) may be related to the input audio signal x(n) by:

$$y(n) = \sum_{i=0}^{2N} h(2N - i)x(n - i) \quad (14)$$

where n represents an audio sample index; 2N represents the order of the FIR filter; and h(i) represents the filter coefficients.

Generally, the audio analysis in step 110 and the filter coefficient updating in steps 120 to 140 may introduce some latency. For the purpose of real time processing, in some example embodiments, the audio analysis and the filter coefficient updating may be performed in parallel with the filtering of the audio signal. That is, the time domain filter may aim for real time processing of the input audio signal. Whenever the updated filter coefficients are obtained, the time domain filter processes the audio signal accordingly. For example, the updated filter coefficients obtained in step 130 of the method 100 may be used to filter the corresponding audio sample of the first audio portion. Alternatively, the beginning part of the first audio portion may be filtered based on the filter coefficients for a prior audio portion, until the resulting filter coefficients for the first portion are converged in step 140.

Figure 4:
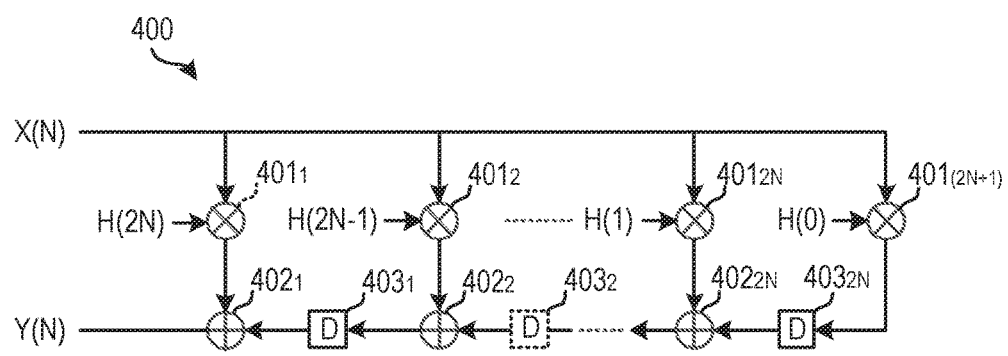
FIG. 4 is block diagrams of a time domain filter in accordance with one example embodiment disclosed herein.

The time domain filter may be implemented by the filter coefficients in various manners. In some example embodiments, for each audio sample of an input audio signal, multiplications of this sample with all the filter coefficients are pre-calculated in the time domain filter and the products are stored. Then, an output audio signal is calculated as a sum of all the delayed products. FIG. 4 depicts a block diagram of such a time domain filter 400. The time domain filter 400 has a length of 2N. As shown, the time domain filter 400 includes (2N+1) multipliers $401_1$, $401_2$, ..., $401_{2N}$, $401_{(2N+1)}$. (2N+1) filter coefficients obtained from the filter coefficient updating procedure may be applied to the (2N+1) multipliers respectively, so as to multiply with each sample of the input audio signal x(n).

The time domain filter 400 also includes 2N adders $402_1$, $402_2$, ..., $402_{2N}$ and 2N delay units $403_1$, $403_2$, ..., $403_{2N}$. The products from the multipliers $401_2$, ..., $401_{2N}$, $401_{(2N+1)}$ are delayed in the corresponding delay units 403. It can be seen that the audio sample multiplied in the multiplier $401_1$ is not delayed. Each of the delay units 403 may delay the products for one audio sample. All the delayed products and the product from the multiplier $401_1$ are added together to obtain the output audio signal y(n). One advantage of this structure of time domain filter is that the resulting output audio signal will transition smoothly if the filter coefficients vary frequently in magnitudes.

Figure 5:
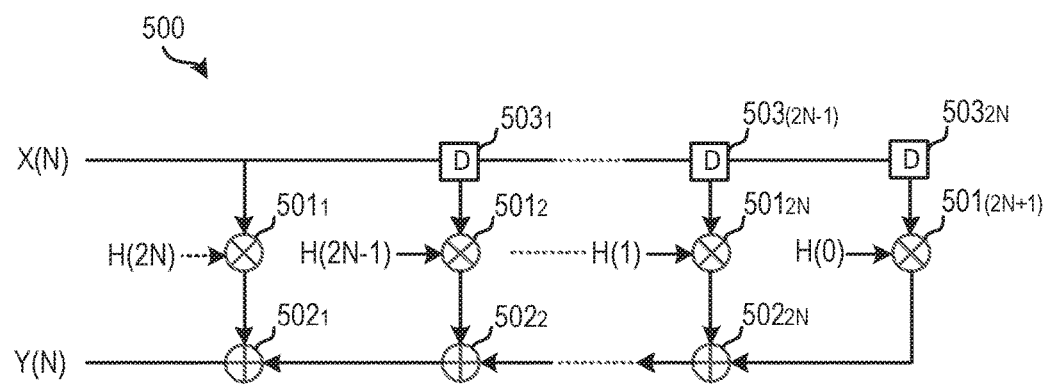
FIG. 5 is block diagrams of a time domain filter in accordance with another example embodiment disclosed herein.

In some other example embodiments, the time domain filter may have other structures. For example, each audio sample of the input audio signal may be first delayed and then multiplied with the filter coefficients. The products of the multiplications may be added together to obtain the output audio signal. FIG. 5 depicts a block diagram of a time domain filter 500 for this example. Each audio sample of the input audio signal x(n) first goes through 2N delay units $503_1$, ..., $503_{(2N-1)}$, $503_{2N}$ and then multiplied with (2N+1) filter coefficients by (2N+1) multipliers $501_1$, $501_2$, ..., $501_{2N}$, $501_{(2N+1)}$, respectively. It can be seen that the audio sample to be multiplied in the multiplier $501_1$ is not delayed. The products of the (2N+1) multiplications may be summed by 2N adders $502_1$, $502_2$, ..., $502_{2N}$ to provide the output audio signal y(n).

It is to be appreciated that the structures of the time domain filter is described only for the purpose of illustration without suggesting any limitations as to the scope of the subject matter disclosed herein. The time domain filter can be embodied with other different structures. In some example embodiments, the time domain filter may be implemented by a modern DSP as most practical modern DSP hardware includes dedicated circuits for operations of multiplications and additions that are involved in time domain filtering. It will be appreciated that any other kinds of processors may also be employed such, for example, as general purpose processors and the like as described below with reference to FIG. 7. The scope of the subject matter disclosed herein is not limited in this regard.

In some example embodiments, in order to reduce the computational complexity in the audio signal filtering procedure, some filter coefficients with small values among the updated filter coefficients may not be used to multiply the audio sample. Particularly, if any of the updated filter coefficients is small, for example, almost equal to zero, the corresponding multiplier may stop operating and the output in this branch will be directly set to zero. For example, in the time domain filter 500, if the filter coefficient h(2N) is has a value that is almost equal to zero, the multiplication operation in the branch of multiplier $501_1$ is avoided. Alternatively, or in addition, if it is observed that one or more of the filter coefficients are kept as small values for a long time, the time domain filter may be configured with a lower order. Thus, the number of target gains P, which is dependent on the order of the filter as described above, can be reduced to a smaller value. This brings out a direct benefit for the computational complexity and the convergence speed of the filer coefficient updating procedure.

Figure 6:
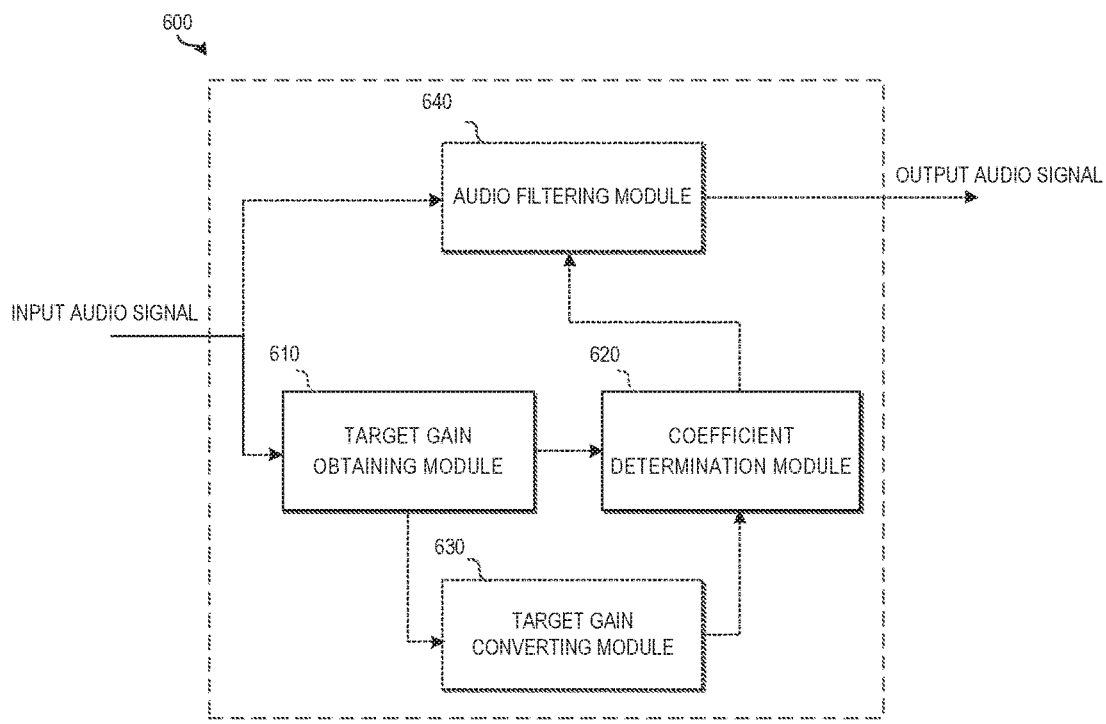
FIG. 6 is a block diagram of a system for processing an audio signal in accordance with one example embodiment disclosed herein.

FIG. 6 is a block diagram of a system for processing an audio signal 600 in accordance with an example embodiment disclosed herein. As shown, the system 600 includes a target gain obtaining module 610 configured to obtain a predetermined number of target gains for a first portion of the audio signal by analyzing the first portion of the audio signal. Each of the target gains corresponding to a linear subband of the audio signal. The system 600 also includes a coefficient determination module 620 configured to determine a filter coefficient for filtering the first portion of the audio signal by iteratively selecting at least one target gain from the target gains, and updating the filter coefficient based on the selected at least one target gain.

In some example embodiments disclosed herein, the target gain obtaining module 610 may be further configured to determine the predetermined number based on an order of the filtering.

In some example embodiments disclosed herein, the coefficient determination module 620 may be further configured to select at least one target gain from the target gains based on at least one of the following: computation resources available for the updating of the filter coefficient, or a convergence requirement of the updating of the filter coefficient.

In some example embodiments disclosed herein, the coefficient determination module 620 may be further configured to, for a first target gain from the target gains for the first portion, determine a difference between the first target gain and a second target gain for a second portion of the audio signal, the second portion being prior to the first portion, the first and second target gains being corresponding to a same linear subband. The coefficient determination module 620 may be further configured to select the first target gain in response to the difference being higher than a predetermined threshold.

In some example embodiments disclosed herein, the coefficient determination module 620 may be configured to obtain a mapping that correlates the selected at least one target gain to the filter coefficient. The coefficient determination module 620 may be further configured to update the filter coefficient based on the selected at least one target gain and the mapping.

In some example embodiments disclosed herein, the coefficient determination module 620 may be configured to, for a first target gain from the selected at least one target gain for the first portion, smooth the first target gain based on a smoothing factor and a second target gain for a second portion of the audio signal, the second portion being prior to the first portion, the first and second target gains being corresponding to a same linear subband. The coefficient determination module 620 may be further configured to update the filter coefficient based on the smoothed target gain.

It is assumed that the predetermined number is a first predetermined number. In some example embodiments disclosed herein, the system 600 may optionally comprise a target gain converting module 630 configured to convert the first predetermined number of target gains into a second predetermined number of target gains, each of the second predetermined number of target gains corresponding to a perceptual subband of the audio signal, the second predetermined number being lower than the first predetermined number. In these embodiments, the coefficient determination module 620 may be further configured to select at least one target gain from the second predetermined number of target gains.

In some example embodiments disclosed herein, the system 600 may optionally comprise an audio filtering module 640 configured to filter the first portion of the audio signal in time domain based on the updated filter coefficient. In some embodiments, the audio filtering module 640 may include a time domain filter which is adjusted adaptively based on the updated filter coefficient.

It is also to be understood that the components of the system 600 may be a hardware module or a software unit module. For example, in some example embodiments, the system may be implemented partially or completely as software and/or in firmware, for example, implemented as a computer program product embodied in a computer readable medium. Alternatively or additionally, the system may be implemented partially or completely based on hardware, for example, as an integrated circuit (IC), an application-specific integrated circuit (ASIC), a system on chip (SOC), a field programmable gate array (FPGA), and so forth. The scope of the subject matter disclosed herein is not limited in this regard.

Figure 7:
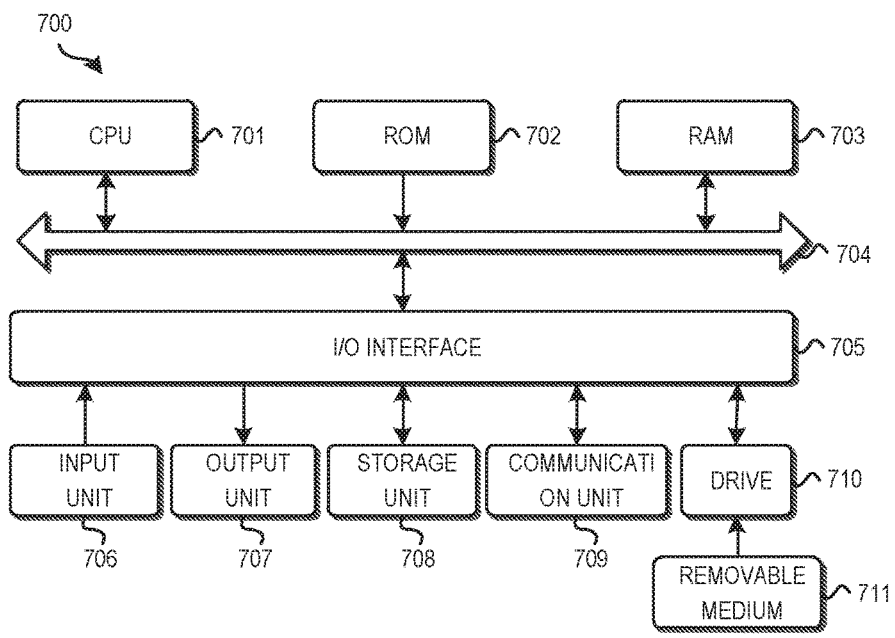
FIG. 7 is a block diagram of an example computer system suitable for implementing example embodiments disclosed herein.

FIG. 7 depicts a block diagram of an example computer system 700 suitable for implementing example embodiments disclosed herein. As depicted, the computer system 700 comprises a central processing unit (CPU) 701 which is capable of performing various processes in accordance with a program stored in a read only memory (ROM) 702 or a program loaded from a storage unit 708 to a random access memory (RAM) 703. In the RAM 703, data required when the CPU 701 performs the various processes or the like is also stored as required. The CPU 701, the ROM 702 and the RAM 703 are connected to one another via a bus 704. An input/output (I/O) interface 705 is also connected to the bus 704.

The following components are connected to the I/O interface 705: an input unit 706 including a keyboard, a mouse, or the like; an output unit 707 including a display such as a cathode ray tube (CRT), a liquid crystal display (LCD), or the like, and a loudspeaker or the like; the storage unit 708 including a hard disk or the like; and a communication unit 709 including a network interface card such as a LAN card, a modem, or the like. The communication unit 709 performs a communication process via the network such as the internet. A drive 710 is also connected to the I/O interface 705 as required. A removable medium 711, such as a magnetic disk, an optical disk, a magneto-optical disk, a semiconductor memory, or the like, is mounted on the drive 710 as required, so that a computer program read therefrom is installed into the storage unit 708 as required.

Specifically, in accordance with example embodiments disclosed herein, the method described above with reference to FIG. 1 may be implemented as computer software programs. For example, example embodiments disclosed herein comprise a computer program product including a computer program tangibly embodied on a machine readable medium, the computer program including program code for performing the method 100. In such embodiments, the computer program may be downloaded and mounted from the network via the communication unit 709, and/or installed from the removable medium 711.

Generally speaking, various example embodiments disclosed herein may be implemented in hardware or special purpose circuits, software, logic or any combination thereof. Some aspects may be implemented in hardware, while other aspects may be implemented in firmware or software which may be executed by a controller, microprocessor or other computing device. While various aspects of the example embodiments disclosed herein are illustrated and described as block diagrams, flowcharts, or using some other pictorial representation, it will be appreciated that the blocks, apparatus, systems, techniques or methods disclosed herein may be implemented in, as non-limiting examples, hardware, software, firmware, special purpose circuits or logic, general purpose hardware or controller or other computing devices, or some combination thereof.

Additionally, various blocks shown in the flowcharts may be viewed as method steps, and/or as operations that result from operation of computer program code, and/or as a plurality of coupled logic circuit elements constructed to carry out the associated function(s). For example, example embodiments disclosed herein include a computer program product comprising a computer program tangibly embodied on a machine readable medium, the computer program containing program codes configured to carry out the methods as described above.

In the context of the disclosure, a machine readable medium may be any tangible medium that can contain, or store a program for use by or in connection with an instruction execution system, apparatus, or device. The machine readable medium may be a machine readable signal medium or a machine readable storage medium. A machine readable medium may include, but not limited to, an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Computer program code for carrying out methods disclosed herein may be written in any combination of one or more programming languages. These computer program codes may be provided to a processor of a general purpose computer, special purpose computer, or other programmable data processing apparatus, such that the program codes, when executed by the processor of the computer or other programmable data processing apparatus, cause the functions/operations specified in the flowcharts and/or block diagrams to be implemented. The program code may execute entirely on a computer, partly on the computer, as a stand-alone software package, partly on the computer and partly on a remote computer or entirely on the remote computer or server. The program code may be distributed on specially-programmed devices which may be generally referred to herein as "modules". Software component portions of the modules may be written in any computer language and may be a portion of a monolithic code base, or may be developed in more discrete code portions, such as is typical in object-oriented computer languages. In addition, the modules may be distributed across a plurality of computer platforms, servers, terminals, mobile devices and the like. A given module may even be implemented such that the described functions are performed by separate processors and/or computing hardware platforms.

As used in this application, the term "circuitry" refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. Further, it is well known to the skilled person that communication media typically embodies computer readable instructions, data structures, program modules or other data in a modulated data signal such as a carrier wave or other transport mechanism and includes any information delivery media.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the subject matter disclosed herein or of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination.

Various modifications, adaptations to the foregoing example embodiments disclosed herein may become apparent to those skilled in the relevant arts in view of the foregoing description, when read in conjunction with the accompanying drawings. Any and all modifications will still fall within the scope of the non-limiting and example embodiments disclosed herein. Furthermore, other embodiments disclosed herein will come to mind to one skilled in the art to which those embodiments pertain having the benefit of the teachings presented in the foregoing descriptions and the drawings.

It will be appreciated that the embodiments of the subject matter disclosed herein are not to be limited to the specific embodiments disclosed and that modifications and other embodiments are intended to be included within the scope of the appended claims. Although specific terms are used herein, they are used in a generic and descriptive sense only and not for purposes of limitation.

Various aspects of the present invention may be appreciated from the following enumerated example embodiments (EEEs).

EEE 1. A method of processing an audio signal comprising:
 obtaining a predetermined number of target gains for a first portion of the audio signal by analyzing the first portion of the audio signal, each of the target gains corresponding to a linear subband of the audio signal; and
 determining a filter coefficient for filtering the first portion of the audio signal by iteratively
  selecting at least one target gain from the target gains, and
  updating the filter coefficient based on the selected at least one target gain.

EEE 2. The method of EEE 1, wherein obtaining the target gains comprises:

determining the predetermined number based on an order of the filtering.

EEE 3. The method of EEE 1 or 2, wherein selecting at least one target gain from the target gains comprises:
 selecting at least one target gain from the target gains based on at least one of the following:
  computation resources available for the updating of the filter coefficient, or
  a convergence requirement of the updating of the filter coefficient.

EEE 4. The method of any of EEEs 1 to 3, wherein selecting at least one target gain from the target gains comprises:
 for a first target gain from the target gains for the first portion, determining a difference between the first target gain and a second target gain for a second portion of the audio signal, the second portion being prior to the first portion, the first and second target gains being corresponding to a same linear subband; and
 selecting the first target gain in response to the difference exceeding a predetermined threshold.

EEE 5. The method of any of EEEs 1 to 4, wherein updating the filter coefficient based on the selected at least one target gain comprises:
 obtaining a mapping that correlates the selected at least one target gain to the filter coefficient; and
 updating the filter coefficient based on the selected at least one target gain and the mapping.

EEE 6. The method of any of EEEs 1 to 5, wherein updating the filter coefficient based on the selected at least one target gain comprises:
 for a first target gain from the selected at least one target gain for the first portion, smoothing the first target gain based on a smoothing factor and a second target gain for a second portion of the audio signal, the second portion being prior to the first portion, the first and second target gains being corresponding to a same linear subband; and
 updating the filter coefficient based on the smoothed target gain.

EEE 7. The method of any of EEEs 1 to 6, wherein the predetermined number is a first predetermined number, the method further comprising:
 converting the first predetermined number of target gains into a second predetermined number of target gains, each of the second predetermined number of target gains corresponding to a perceptual subband of the audio signal, the second predetermined number being lower than the first predetermined number, and
 wherein selecting at least one target gain from the target gains comprises:
  selecting at least one target gain from the second predetermined number of target gains.

EEE 8. The method of any of EEEs 1 to 7, further comprising:
 filtering the first portion of the audio signal in time domain based on the updated filter coefficient.

EEE 9. The method of any of EEEs 1 to 8, wherein the filter coefficient is determined based on a least square method.

EEE 10. The method of any of EEEs 1 to 9, wherein the filter coefficient is updated based on the selected at least one target gain and a predetermined mapping matrix.

EEE 11. The method of EEE 10, wherein the updating comprises selecting a mapping column from the mapping matrix based on the selected at least one target gain.

EEE 12. The method of any previous EEE, wherein the filter coefficient is updated based on a linear combination of the selected target gains and respective mapping columns from the mapping matrix.

EEE 13. A system for processing an audio signal, comprising:
 a target gain obtaining module configured to obtain a predetermined number of target gains for a first portion of the audio signal by analyzing the first portion of the audio signal, each of the target gains corresponding to a linear subband of the audio signal; and
 a coefficient determination module configured to determine a filter coefficient for filtering the first portion of the audio signal by iteratively:
  selecting at least one target gain from the target gains, and
  updating the filter coefficient based on the selected at least one target gain.

EEE 14. The system of EEE 13, wherein the target gain obtaining module is further configured to determine the predetermined number based on an order of the filtering.

EEE 15. The system of EEE 13 or 14, wherein the coefficient determination module is further configured to select at least one target gain from the target gains based on at least one of the following:
 computation resources available for the updating of the filter coefficient, or
 a convergence requirement of the updating of the filter coefficient.

EEE 16. The system of any of EEEs 13 to 15, wherein the coefficient determination module is further configured to:
 for a first target gain from the target gains for the first portion, determine a difference between the first target gain and a second target gain for a second portion of the audio signal, the second portion being prior to the first portion, the first and second target gains being corresponding to a same linear subband; and
 select the first target gain in response to the difference exceeding a predetermined threshold.

EEE 17. The system of any of EEEs 13 to 16, wherein the coefficient determination module is further configured to:
 obtain a mapping that correlates the selected at least one target gain to the filter coefficient; and
 update the filter coefficient based on the selected at least one target gain and the mapping.

EEE 18. The system of any of EEEs 13 to 17, wherein the coefficient determination module is further configured to:
 for a first target gain from the selected at least one target gain for the first portion, smooth the first target gain based on a smoothing factor and a second target gain for a second portion of the audio signal, the second portion being prior to the first portion, the first and second target gains being corresponding to a same linear subband; and
 update the filter coefficient based on the smoothed target gain.

EEE 19. The system of any of EEEs 13 to 18, wherein the predetermined number is a first predetermined number, the system further comprising:
 a target gain converting module configured to convert the first predetermined number of target gains into a second predetermined number of target gains, each of the second predetermined number of target gains corresponding to a perceptual subband of the audio signal, the second predetermined number being lower than the first predetermined number, and
 wherein the coefficient determination module is further configured to select at least one target gain from the second predetermined number of target gains.

EEE 20. The system of any of EEEs 13 to 19, further comprising:
an audio filtering module configured to filter the first portion of the audio signal in time domain based on the updated filter coefficient.

20. The system of any of claims 13 to 19, wherein the filter coefficient is determined based on a least square method.

21. The system of any of claims 13 to 20, wherein the filter coefficient is updated based on the selected at least one target gain and a predetermined mapping matrix.

22. The system of claim 21, wherein the updating comprises selecting a mapping column from the mapping matrix corresponding to the selected at least one target gain.

23. The system of any of claims 13 to 22, wherein the filter coefficients are updated based on a linear combination of the selected target gains and respective mapping columns in the mapping matrix.

EEE 24. A computer program product for processing an audio signal, comprising a computer program tangibly embodied on a machine readable medium, the computer program containing program code for performing the method according to any one of EEEs 1 to 12.

The invention claimed is:

1. A method of processing an audio signal comprising:
obtaining a predetermined number of target gains for a first portion of the audio signal by analyzing the first portion of the audio signal, the first portion including a plurality of audio samples of the audio signal, and each of the target gains corresponding to a subband of the audio signal; and
determining filter coefficients for a time-domain filter for filtering the first portion of the audio signal so as to approximate a frequency response given by the obtained target gains, wherein the filter coefficients are determined iteratively and an iteration comprises:
selecting at least one target gain from the obtained target gains, and
updating the filter coefficients once for each audio sample or for each group of audio samples, based on the filter coefficients of a previous iteration and the selected at least one target gain, and
filtering the first portion of the audio signal in time domain based on the filter coefficients.

2. The method of claim 1, wherein obtaining the target gains comprises:
determining the predetermined number based on an order of the filtering.

3. The method of claim 1, wherein selecting at least one target gain from the target gains comprises:
selecting at least one target gain from the target gains based on at least one of the following:
computation resources available for the updating of the filter coefficient, or
a convergence requirement of the updating of the filter coefficient.

4. The method of claim 1, wherein selecting at least one target gain from the target gains comprises:
for a first target gain from the target gains for the first portion, determining a difference between the first target gain and a second target gain for a second portion of the audio signal, the second portion being prior to the first portion, the first and second target gains being corresponding to a same linear subband; and
selecting the first target gain in response to the difference exceeding a predetermined threshold.

5. The method of claim 1, wherein updating the filter coefficient based on the selected at least one target gain comprises:
obtaining a mapping that correlates the selected at least one target gain to the filter coefficient; and
updating the filter coefficient based on the selected at least one target gain and the mapping.

6. The method of claim 1, wherein updating the filter coefficient based on the selected at least one target gain comprises:
for a first target gain from the selected at least one target gain for the first portion, smoothing the first target gain based on a smoothing factor and a second target gain for a second portion of the audio signal, the second portion being prior to the first portion, the first and second target gains being corresponding to a same linear subband; and
updating the filter coefficient based on the smoothed target gain.

7. The method of claim 1, wherein the predetermined number is a first predetermined number and the subbands are linear subbands, the method further comprising:
converting the first predetermined number of target gains into a second predetermined number of target gains, each of the second predetermined number of target gains corresponding to a perceptual subband of the audio signal, the second predetermined number being lower than the first predetermined number, and
wherein selecting at least one target gain from the target gains comprises:
selecting at least one target gain from the second predetermined number of target gains.

8. A system for processing an audio signal, comprising:
a target gain obtaining module configured to obtain a predetermined number of target gains for a first portion of the audio signal by analyzing the first portion of the audio signal, the first portion including a plurality of audio samples of the audio signal, and each of the target gains corresponding to a subband of the audio signal; and
a coefficient determination module configured to determine filter coefficients for a time-domain filter for filtering the first portion of the audio signal so as to approximate a frequency response given by the obtained target gains, wherein the filter coefficients are determined iteratively and an iteration comprises:
selecting at least one target gain from the obtained target gains, and
updating the filter coefficients once for each audio sample or for each group of audio samples, based on the filter coefficients of a previous iteration and the selected at least one target gain, and
an audio filtering module configured to filter the first portion of the audio signal in time domain based on the updated filter coefficients.

9. The system of claim 8, wherein the target gain obtaining module is further configured to determine the predetermined number based on an order of the filtering.

10. The system of claim 8, wherein the coefficient determination module is further configured to select at least one target gain from the target gains based on at least one of the following:
computation resources available for the updating of the filter coefficient, or
a convergence requirement of the updating of the filter coefficient.

11. The system of claim 8, wherein the coefficient determination module is further configured to:
- for a first target gain from the target gains for the first portion, determine a difference between the first target gain and a second target gain for a second portion of the audio signal, the second portion being prior to the first portion, the first and second target gains being corresponding to a same linear subband; and
- select the first target gain in response to the difference exceeding a predetermined threshold.

12. The system of claim 8, wherein the coefficient determination module is further configured to:
- obtain a mapping that correlates the selected at least one target gain to the filter coefficient; and
- update the filter coefficient based on the selected at least one target gain and the mapping.

13. The system of claim 8, wherein the coefficient determination module is further configured to:
- for a first target gain from the selected at least one target gain for the first portion, smooth the first target gain based on a smoothing factor and a second target gain for a second portion of the audio signal, the second portion being prior to the first portion, the first and second target gains being corresponding to a same linear subband; and
- update the filter coefficient based on the smoothed target gain.

14. The system of claim 8, wherein the predetermined number is a first predetermined number and the subbands are linear subbands, the system further comprising:
- a target gain converting module configured to convert the first predetermined number of target gains into a second predetermined number of target gains, each of the second predetermined number of target gains corresponding to a perceptual subband of the audio signal, the second predetermined number being lower than the first predetermined number, and
- wherein the coefficient determination module is further configured to select at least one target gain from the second predetermined number of target gains.

15. A computer program product for processing an audio signal, comprising a computer program tangibly embodied on a non-transitory machine readable medium, the computer program containing program code for performing the method according to claim 1.

* * * * *